(12) United States Patent
Embleton et al.

(10) Patent No.: US 11,297,747 B2
(45) Date of Patent: Apr. 5, 2022

(54) SYSTEM AND METHOD FOR MANAGING ELECTROMAGNETIC INTERFERENCE

(71) Applicant: Dell Products L.P., Hopkinton, MA (US)

(72) Inventors: Steven Embleton, Round Rock, TX (US); Ben John Sy, Austin, TX (US); Eric Michael Tunks, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/516,404

(22) Filed: Jul. 19, 2019

(65) Prior Publication Data

US 2021/0018895 A1 Jan. 21, 2021

(51) Int. Cl.
*H05K 9/00* (2006.01)
*G05B 19/406* (2006.01)

(52) U.S. Cl.
CPC ......... *H05K 9/0041* (2013.01); *H05K 9/0007* (2013.01); *H05K 9/0062* (2013.01); *G05B 19/406* (2013.01); *G05B 2219/31071* (2013.01)

(58) Field of Classification Search
CPC ... H05K 9/0007; H05K 9/0041; H05K 9/0062
See application file for complete search history.

(56) References Cited

U.S. PATENT DOCUMENTS

| | | | |
|---|---|---|---|
| 4,785,136 A | 11/1988 | Mollet et al. | |
| 4,858,309 A | 8/1989 | Korsunsky et al. | |
| 4,871,220 A | 10/1989 | Kohin | |
| 5,049,701 A | 9/1991 | Vowles et al. | |
| 5,084,802 A | 1/1992 | Nguyenngoc | |
| 5,250,752 A | 10/1993 | Cutright | |
| 5,294,748 A | 3/1994 | Schwenk et al. | |
| 5,323,298 A | 6/1994 | Shatas et al. | |
| 5,437,560 A | 8/1995 | Mizuguchi | |
| 5,545,844 A | 8/1996 | Plummer, III et al. | |
| 5,545,845 A | 8/1996 | Flores | |
| 5,649,831 A | 7/1997 | Townsend | |
| 5,762,513 A | 6/1998 | Stine | |
| 5,812,370 A | 9/1998 | Moore et al. | |
| 5,943,218 A | 8/1999 | Liu | |
| 6,011,221 A | 1/2000 | Lecinski et al. | |
| 6,038,130 A | 3/2000 | Boeck et al. | |

(Continued)

OTHER PUBLICATIONS

"Full HD Endoscopes"; joimax® GmbH, May 1, 2019; https://web.archive.org/web/20190501003355/https://www.ioimax.com/en/products/electronic-devices/hd_endoscopes/.

(Continued)

*Primary Examiner* — Rockshana D Chowdhury
*Assistant Examiner* — Douglas R Burtner
(74) *Attorney, Agent, or Firm* — Chamberlain, Hrdlicka, White, Williams & Aughtry

(57) ABSTRACT

A system for providing electromagnetic interference (EMI) suppression for data processing devices includes a frame adapted to receive a data processing device of the data processing devices. The system further includes the data processing device that includes a payload module adapted to suppress EMI from an internal volume to an ambient environment by greater than 80 decibels. The data processing device further includes the internal volume adapted to house EMI emitting devices that generate EMI.

12 Claims, 11 Drawing Sheets

(56) References Cited

U.S. PATENT DOCUMENTS

| | | | |
|---|---|---|---|
| 6,045,385 A | 4/2000 | Kane | |
| 6,068,009 A | 5/2000 | Paes et al. | |
| 6,176,727 B1 | 1/2001 | Liu et al. | |
| 6,208,514 B1 | 3/2001 | Stark et al. | |
| 6,225,554 B1* | 5/2001 | Trehan | H05K 9/0015 174/365 |
| 6,242,690 B1 | 6/2001 | Glover | |
| 6,269,001 B1 | 7/2001 | Matteson et al. | |
| 6,331,940 B1 | 12/2001 | Lin | |
| 6,332,792 B1 | 12/2001 | Lin et al. | |
| 6,370,036 B1 | 4/2002 | Boe | |
| 6,377,451 B1 | 4/2002 | Furuya | |
| 6,437,987 B1 | 8/2002 | Lin | |
| 6,517,369 B1 | 2/2003 | Butterbaugh et al. | |
| 6,613,977 B1 | 9/2003 | Fowler | |
| 6,657,214 B1* | 12/2003 | Foegelle | G01R 29/0821 250/496.1 |
| 6,695,630 B1 | 2/2004 | Ku | |
| 6,870,092 B2* | 3/2005 | Lambert | H05K 9/0041 174/355 |
| 6,947,290 B2 | 9/2005 | Hirata | |
| 7,035,087 B2 | 4/2006 | Tan | |
| 7,075,796 B1 | 7/2006 | Pritchett | |
| 7,133,296 B2 | 11/2006 | Choi et al. | |
| 7,287,996 B1 | 10/2007 | Shing | |
| 7,371,097 B1 | 5/2008 | Pennypacker et al. | |
| 7,371,977 B1 | 5/2008 | Preonas | |
| 7,692,934 B2 | 4/2010 | Bartscher et al. | |
| 7,695,313 B2 | 4/2010 | Karim et al. | |
| 7,757,847 B2 | 7/2010 | Tang et al. | |
| 8,059,414 B2 | 11/2011 | Wei | |
| 8,098,492 B2 | 1/2012 | Rosenberg et al. | |
| 8,243,469 B2 | 8/2012 | Jaze et al. | |
| 8,310,834 B2 | 11/2012 | Furholzer | |
| 8,508,956 B2 | 8/2013 | Nicol | |
| 8,530,756 B1 | 9/2013 | Winch | |
| 8,636,526 B2 | 1/2014 | Funamura et al. | |
| 8,642,900 B2 | 2/2014 | Nordling et al. | |
| 8,662,295 B2 | 3/2014 | Kubota et al. | |
| 8,687,374 B2 | 4/2014 | Watanabe et al. | |
| 8,720,682 B2 | 5/2014 | Navon et al. | |
| 8,760,859 B2* | 6/2014 | Fuchs | G06F 1/182 361/679.33 |
| 8,867,234 B2* | 10/2014 | Heimann | H04Q 1/025 361/818 |
| 8,969,738 B2 | 3/2015 | Ross | |
| 9,019,711 B2 | 4/2015 | Tamura | |
| 9,095,045 B2 | 7/2015 | Rojo et al. | |
| 9,370,132 B2 | 6/2016 | Coppola | |
| 9,497,894 B1 | 11/2016 | Ramsey | |
| 9,549,480 B1 | 1/2017 | Besterman | |
| 9,585,270 B2 | 2/2017 | Yang et al. | |
| 9,603,280 B2* | 3/2017 | Frank | H05K 7/1402 |
| 9,607,660 B2 | 3/2017 | Bennett, II et al. | |
| 9,640,910 B1 | 5/2017 | Chien et al. | |
| 9,642,290 B2* | 5/2017 | Anderson | H05K 9/0003 |
| 9,820,404 B1 | 11/2017 | Wu et al. | |
| 9,829,939 B1 | 11/2017 | Lien et al. | |
| 9,930,816 B2 | 3/2018 | Winch et al. | |
| 10,007,309 B1 | 6/2018 | Imwalle | |
| 10,249,984 B1 | 4/2019 | Rask | |
| 10,364,031 B2 | 7/2019 | Goupil | |
| 10,372,174 B2* | 8/2019 | Baum | H05K 7/1487 |
| 10,420,258 B1 | 9/2019 | Rahilly et al. | |
| 10,477,740 B2 | 11/2019 | Coppola | |
| 10,477,741 B1* | 11/2019 | Bae | H02J 50/10 |
| 10,492,324 B2 | 11/2019 | Miura | |
| 10,520,532 B2 | 12/2019 | Lee | |
| 10,541,519 B1 | 1/2020 | Wavering | |
| 10,542,642 B2 | 1/2020 | Babhadiashar et al. | |
| 10,575,443 B2 | 2/2020 | Woodbury, II et al. | |
| 10,638,634 B1 | 4/2020 | Elsasser | |
| 10,707,636 B2 | 7/2020 | Yamamoto | |
| 10,720,722 B2 | 7/2020 | Tsorng et al. | |
| 10,734,763 B2 | 8/2020 | M R et al. | |
| 10,897,839 B2* | 1/2021 | Bernardin | H05K 7/20836 |
| 2002/0000645 A1 | 1/2002 | Sato et al. | |
| 2002/0001181 A1 | 1/2002 | Kondo | |
| 2002/0027769 A1 | 3/2002 | Kasahara et al. | |
| 2002/0064035 A1* | 5/2002 | Mair | H05K 9/0062 361/800 |
| 2003/0011988 A1* | 1/2003 | Irmer | H02B 1/50 361/690 |
| 2003/0057131 A1* | 3/2003 | Diaferia | B65D 75/20 206/719 |
| 2003/0137811 A1 | 7/2003 | Ling et al. | |
| 2003/0174474 A1 | 9/2003 | Mair et al. | |
| 2003/0174487 A1* | 9/2003 | Garmong | H05K 9/0001 361/816 |
| 2005/0247471 A1 | 11/2005 | Archambeault | |
| 2006/0025010 A1 | 2/2006 | Spitaels et al. | |
| 2007/0105445 A1 | 5/2007 | Manto et al. | |
| 2007/0145699 A1* | 6/2007 | Robbins | H05K 7/18 280/47.26 |
| 2007/0147013 A1 | 6/2007 | Robbins | |
| 2007/0151779 A1* | 7/2007 | Robbins | H05K 7/18 180/65.1 |
| 2008/0076291 A1 | 3/2008 | Ewing et al. | |
| 2009/0021925 A1* | 1/2009 | Heimann | H05K 9/0062 361/818 |
| 2009/0095523 A1 | 4/2009 | Stevenson | |
| 2009/0146862 A1* | 6/2009 | Malone | H05K 9/0045 342/1 |
| 2010/0117579 A1 | 5/2010 | Culbert | |
| 2010/0208433 A1* | 8/2010 | Heimann | H04Q 1/03 361/724 |
| 2010/0270299 A1 | 10/2010 | Baltussen | |
| 2010/0285636 A1 | 11/2010 | Chen | |
| 2010/0319981 A1 | 12/2010 | Kapusta et al. | |
| 2011/0011760 A1* | 1/2011 | Habersetzer | G06F 1/1628 206/320 |
| 2011/0198245 A1* | 8/2011 | Soufan | H04M 1/19 206/216 |
| 2011/0222249 A1* | 9/2011 | Ruehl | H05K 9/0001 361/752 |
| 2011/0232956 A1 | 9/2011 | Ramsey | |
| 2012/0011700 A1 | 1/2012 | Kelaher et al. | |
| 2012/0044653 A1 | 2/2012 | Morris et al. | |
| 2012/0073873 A1* | 3/2012 | Nash | H05K 9/0045 174/382 |
| 2012/0116590 A1 | 5/2012 | Florez-Iarrahondo | |
| 2012/0178364 A1* | 7/2012 | Dobyns | H04W 76/14 455/41.1 |
| 2012/0285738 A1 | 11/2012 | Cochrane et al. | |
| 2013/0160563 A1 | 6/2013 | Dingier et al. | |
| 2013/0194772 A1* | 8/2013 | Rojo | H04Q 1/116 361/818 |
| 2013/0206470 A1* | 8/2013 | Davis | H01R 13/72 174/382 |
| 2013/0258582 A1 | 10/2013 | Shelnutt | |
| 2013/0277520 A1 | 10/2013 | Funk et al. | |
| 2014/0008119 A1* | 1/2014 | Brandt | H05K 9/0073 174/382 |
| 2014/0138388 A1 | 5/2014 | Synnestvedt | |
| 2014/0368821 A1 | 12/2014 | Gazaway et al. | |
| 2015/0014912 A1 | 1/2015 | Ivey et al. | |
| 2015/0245529 A1 | 8/2015 | Tam et al. | |
| 2015/0257310 A1 | 9/2015 | Desouza | |
| 2015/0271959 A1 | 9/2015 | Chen et al. | |
| 2015/0368423 A1 | 12/2015 | Yamauchi et al. | |
| 2015/0373869 A1 | 12/2015 | Macerini et al. | |
| 2016/0081231 A1 | 3/2016 | Berke | |
| 2016/0111814 A1 | 4/2016 | Hirano et al. | |
| 2016/0159480 A1 | 6/2016 | Barth | |
| 2016/0182130 A1* | 6/2016 | Ahmed | H04B 5/02 455/41.1 |
| 2016/0372948 A1 | 12/2016 | Kvols | |
| 2016/0381818 A1 | 12/2016 | Mills | |
| 2017/0187220 A1* | 6/2017 | Rosenfeld | H02J 50/12 |
| 2017/0222847 A1* | 8/2017 | Feher | H04L 27/0008 |
| 2017/0303375 A1* | 10/2017 | Woodhead | H01F 30/02 |
| 2017/0347496 A1* | 11/2017 | Smith | B03C 3/47 |

(56) References Cited

U.S. PATENT DOCUMENTS

| | | |
|---|---|---|
| 2018/0062287 A1 | 3/2018 | Shaw et al. |
| 2018/0257334 A1 | 9/2018 | Motoyanagi et al. |
| 2019/0008079 A1 | 1/2019 | Kondo et al. |
| 2019/0050030 A1* | 2/2019 | Baum .................. G06F 1/189 |
| 2019/0056439 A1* | 2/2019 | Lee .................. G10K 11/002 |
| 2019/0159371 A1 | 5/2019 | Grinsteinner |
| 2019/0230828 A1 | 7/2019 | Murch |
| 2019/0304922 A1 | 10/2019 | Maruthamuthu et al. |
| 2019/0320796 A1 | 10/2019 | Ding |
| 2019/0353356 A1 | 11/2019 | Fischer |
| 2019/0379183 A1 | 12/2019 | Winsor |
| 2020/0187394 A1 | 6/2020 | Murugesan |
| 2020/0187578 A1 | 6/2020 | Sadato |
| 2020/0313584 A1 | 10/2020 | Morel et al. |

OTHER PUBLICATIONS

"JRE 0814 RF Shielded Test Enclosure"; JRE Test, LLC, Apr. 22, 2019; https://web.archive.org/web/20190422094016/https://jretest.com/product/jre-0814/.

"Tapster"; Tapster Robotics, Inc., Sep. 30, 2017; https://web.archive.org/web/20170930111059/https://www.tapster.io/.

Gary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20 Note%20Download.pdf).

* cited by examiner

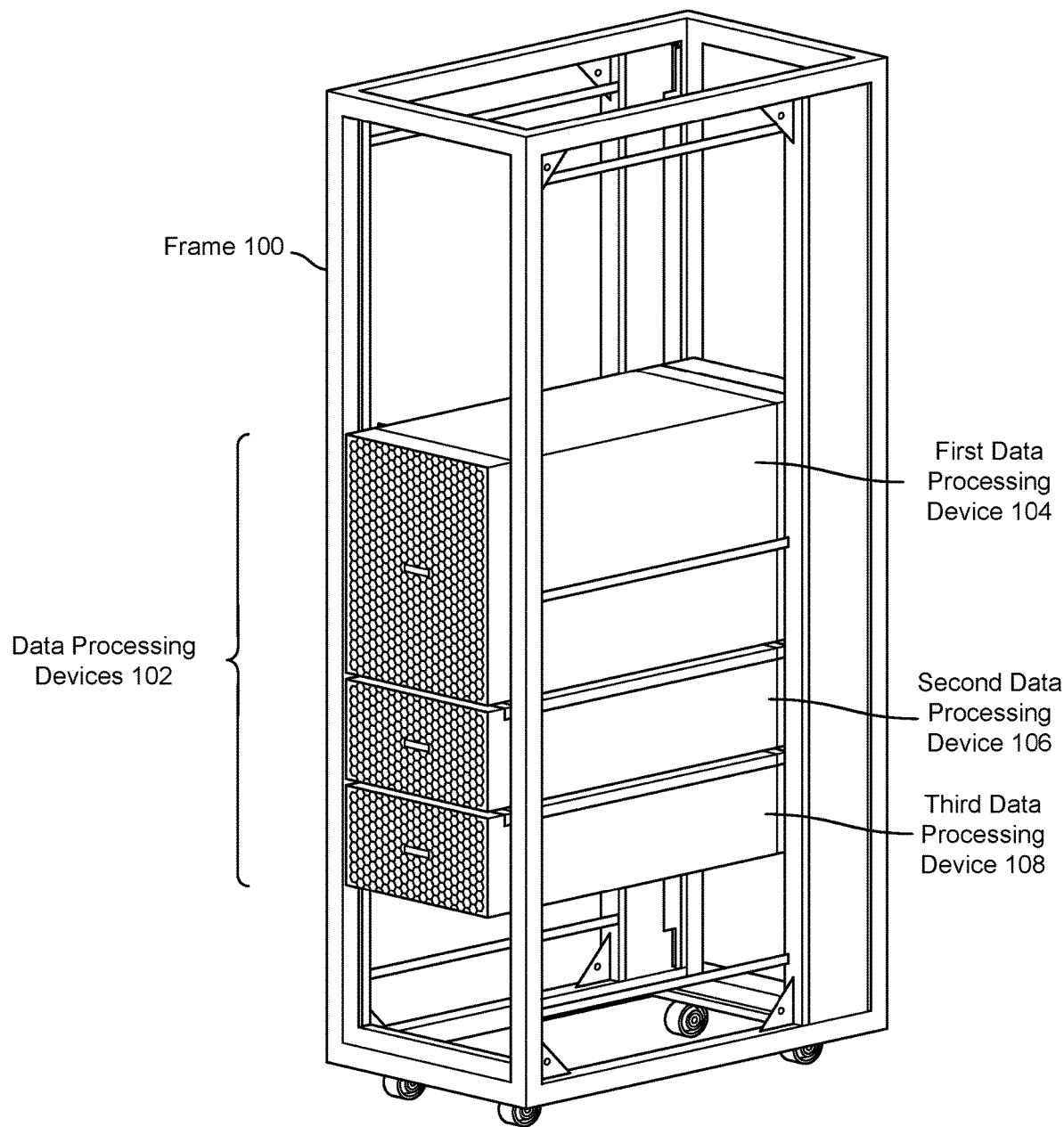
FIG. 1.1

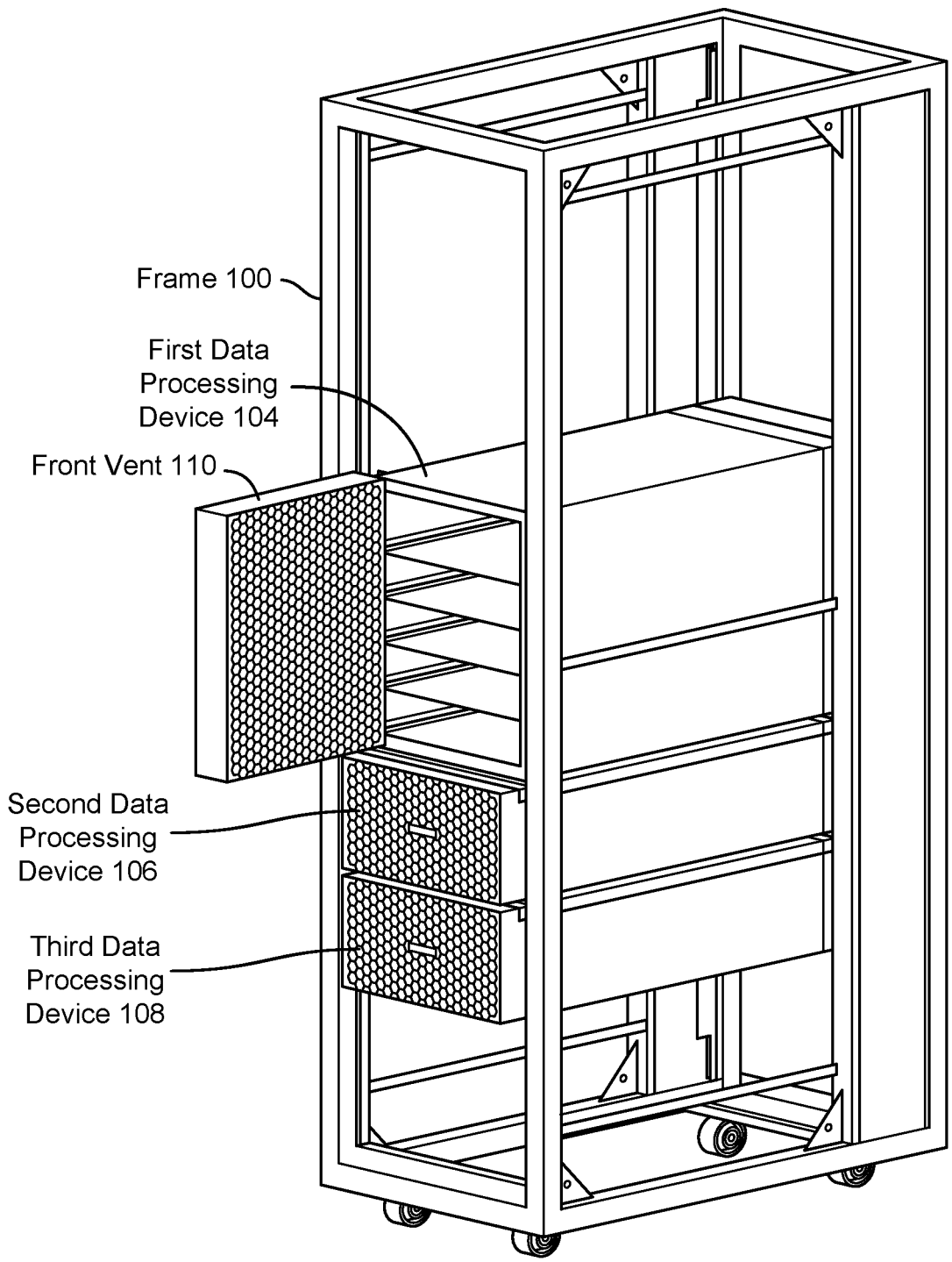
FIG. 1.2

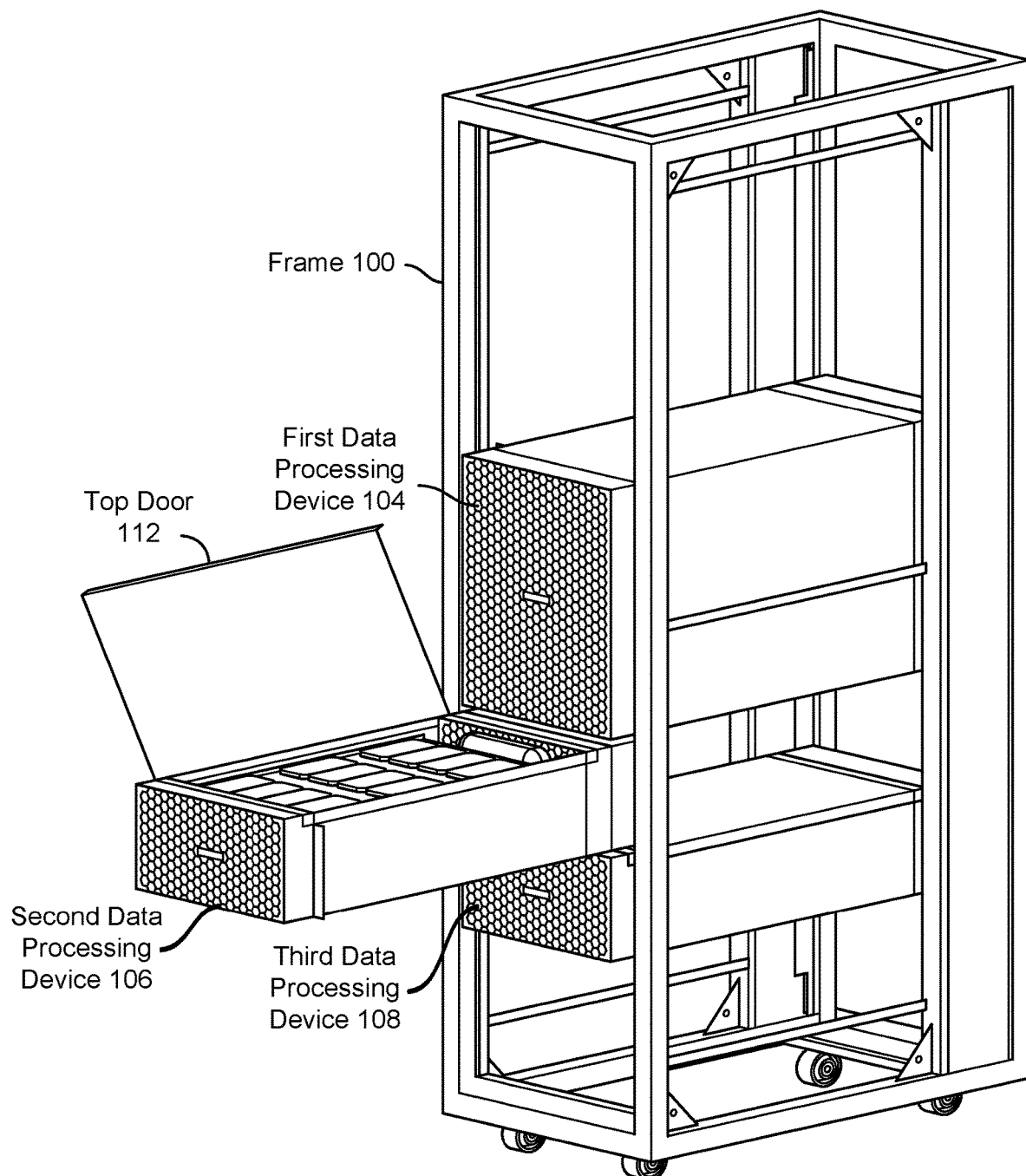
FIG. 1.3

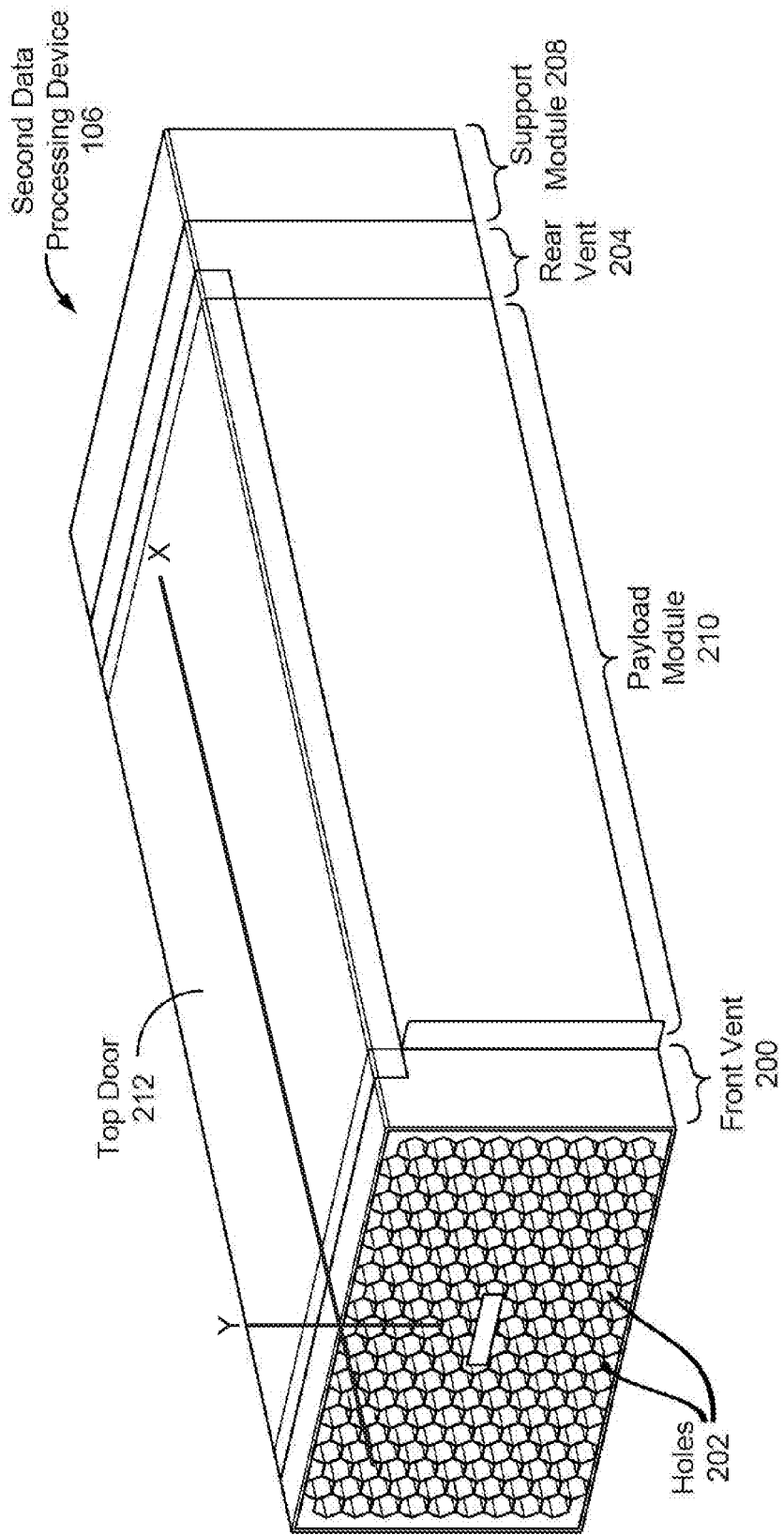
FIG. 2.1

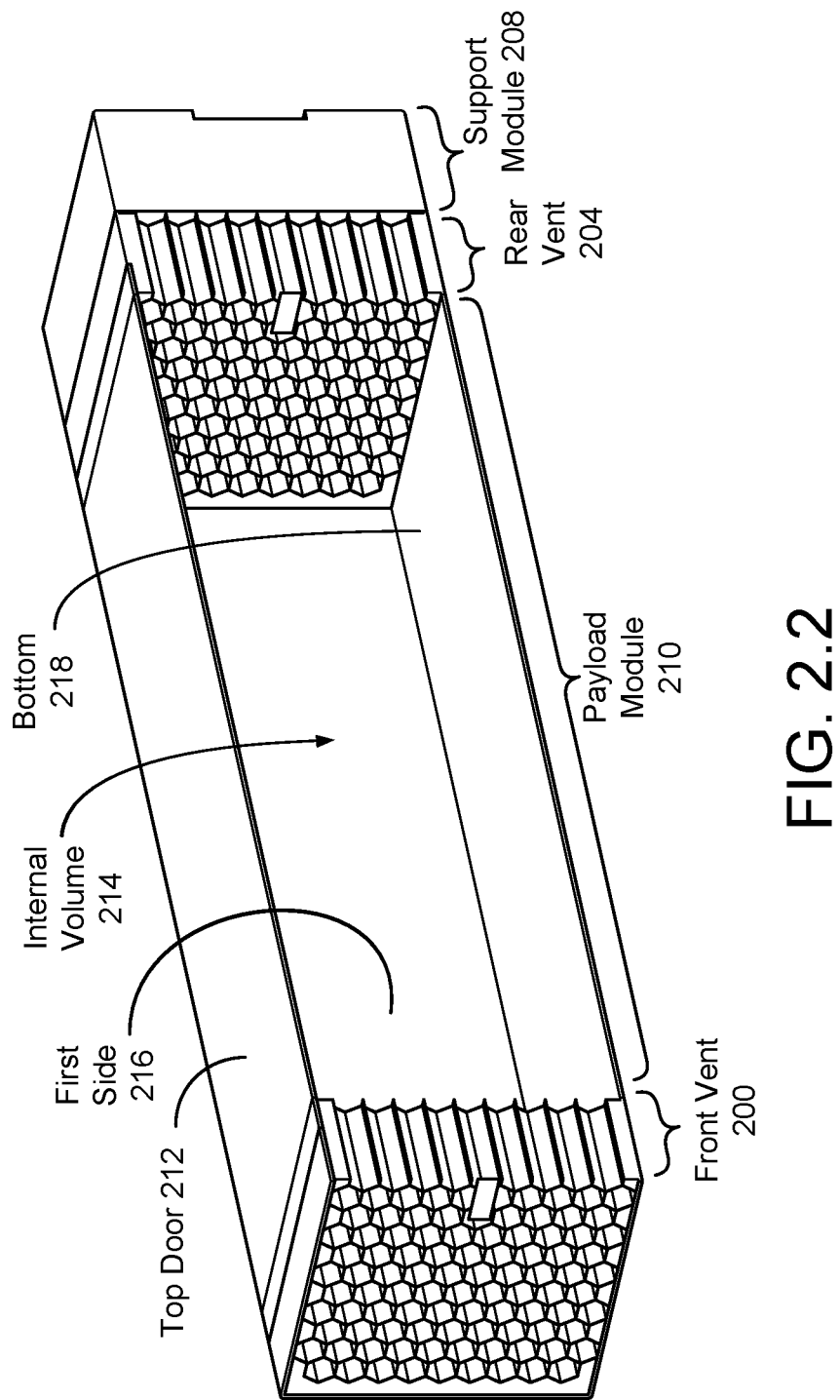
FIG. 2.2

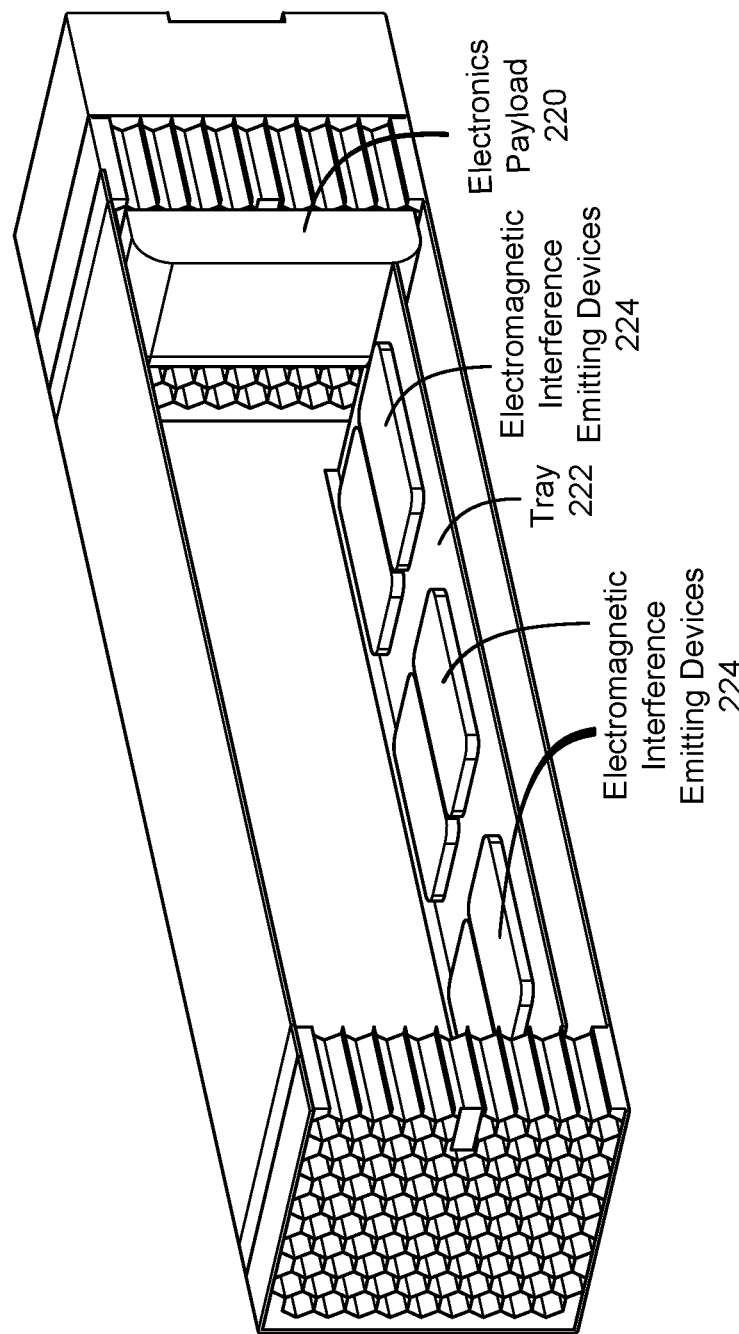
FIG. 2.3

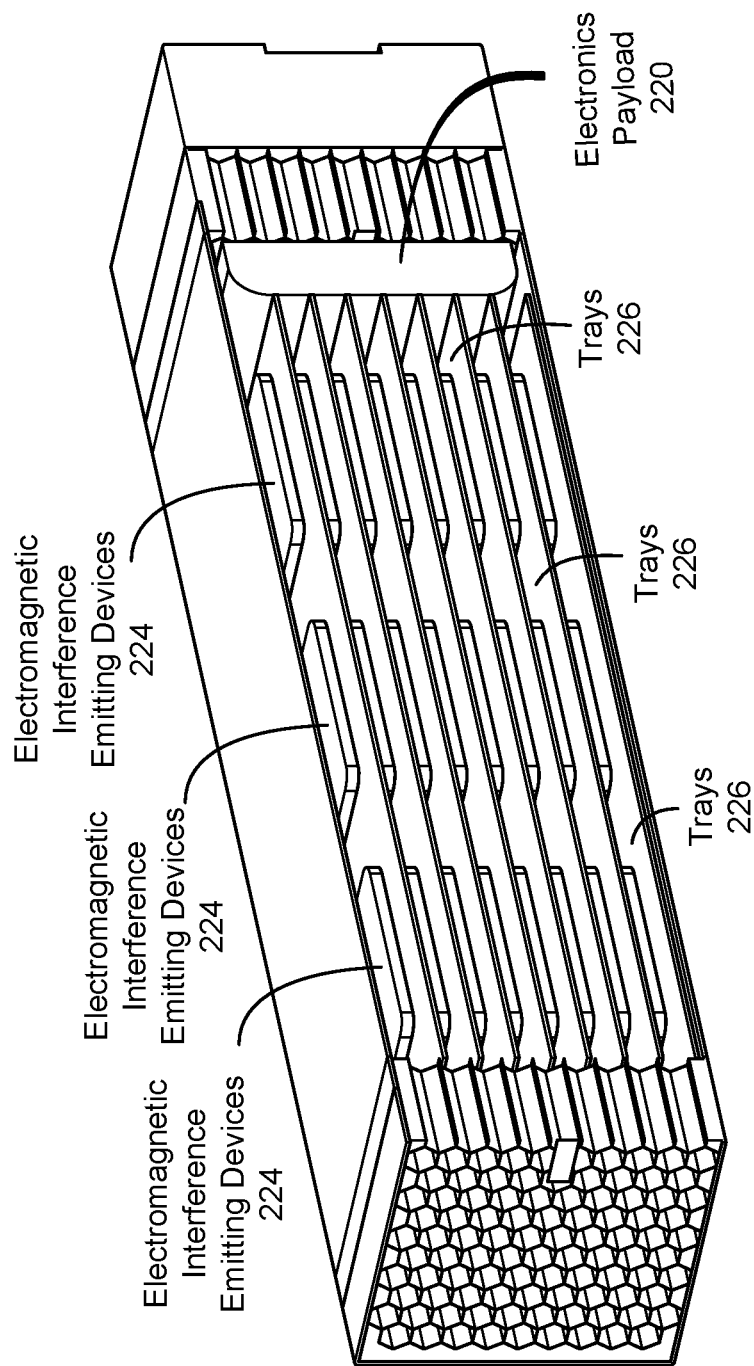
FIG. 2.4

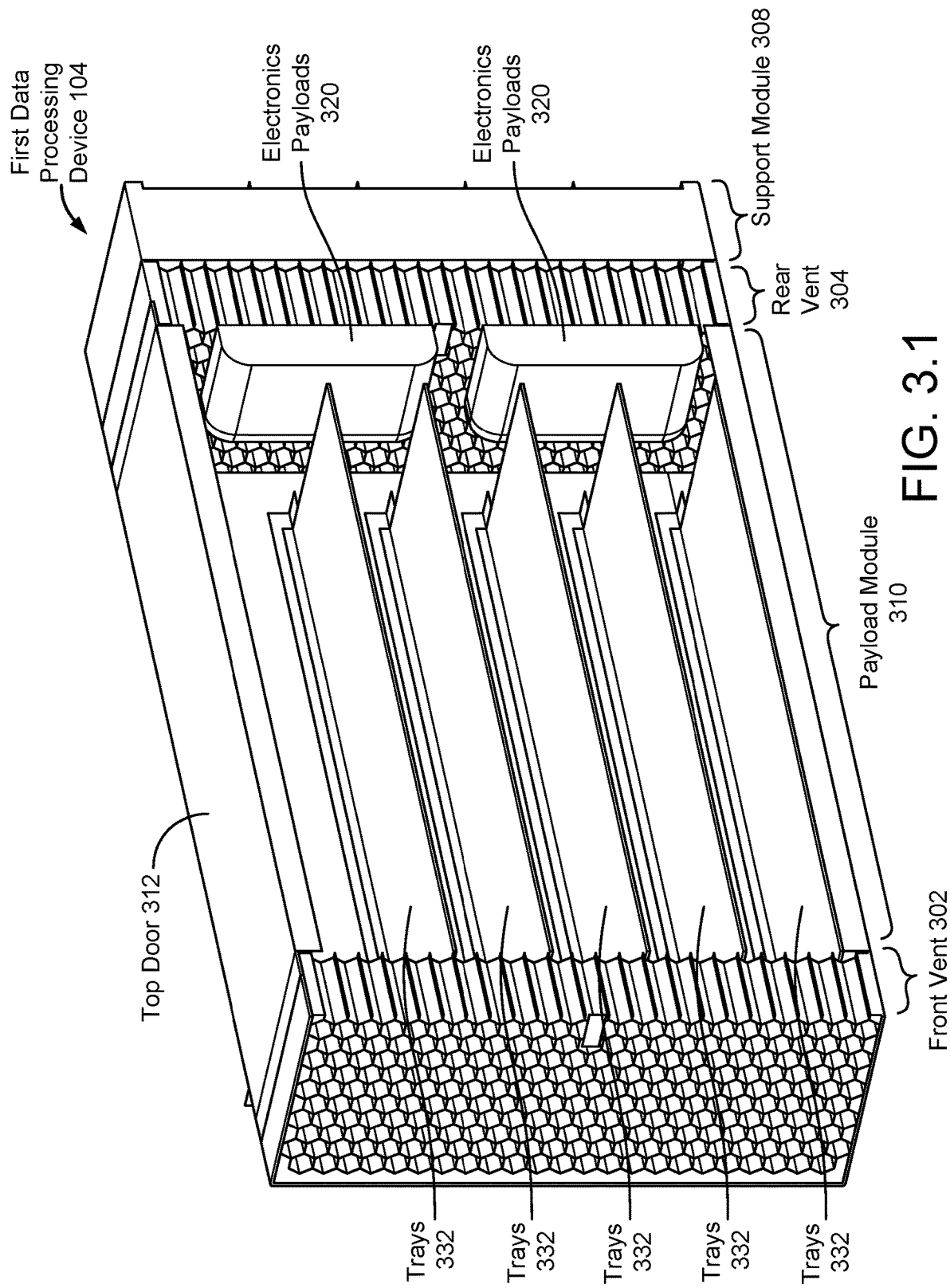
FIG. 3.1

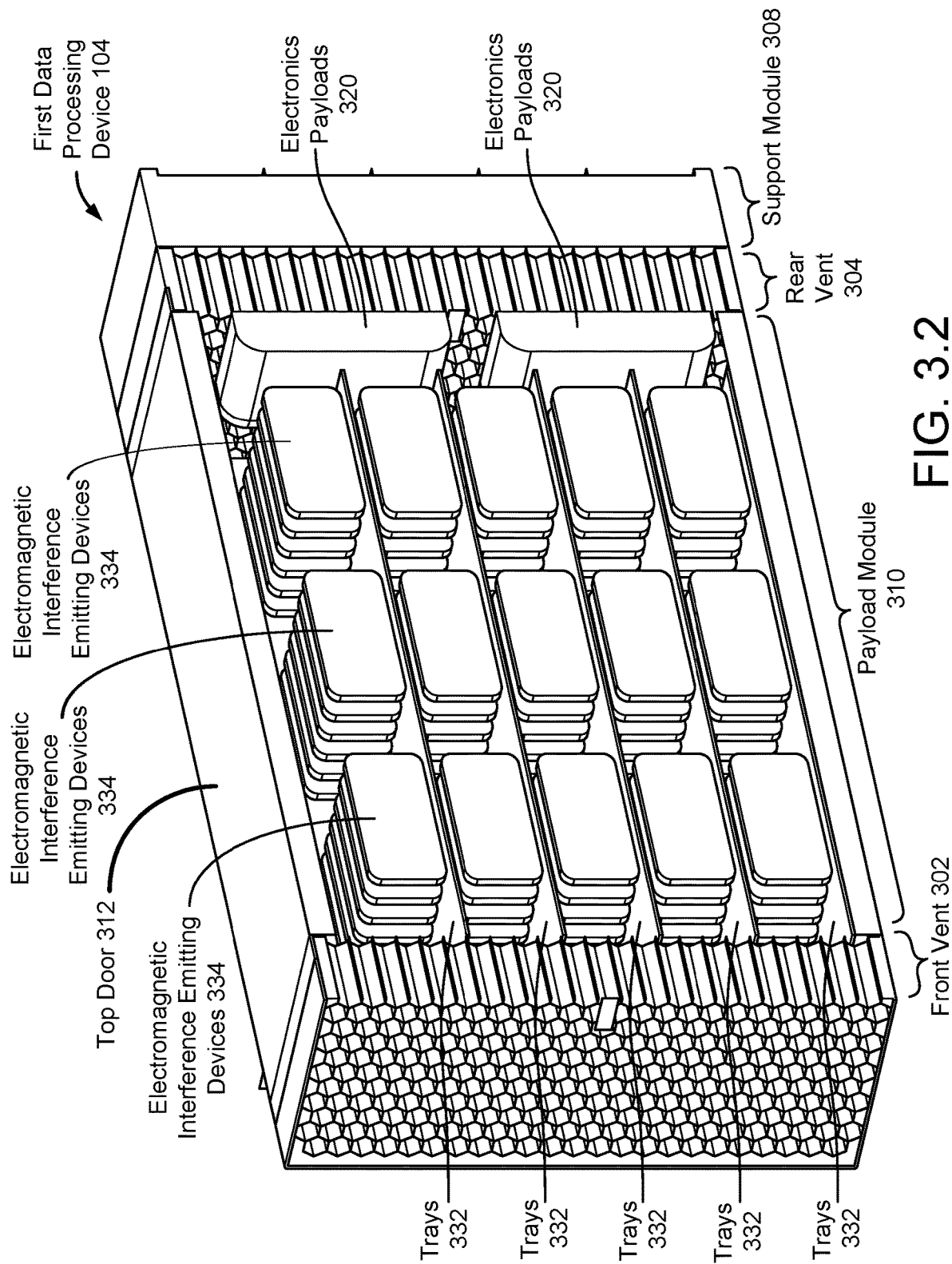
FIG. 3.2

SYSTEM AND METHOD FOR MANAGING ELECTROMAGNETIC INTERFERENCE

BACKGROUND

A high density environment may include devices that are tightly packed together. In other words, the devices may be physically close to each other. Such an environment may present numerous challenges relating to thermal management, mechanical positioning and orienting of devices, and electrical concerns related to power and operation of such devices.

SUMMARY

In one aspect, a data processing device in accordance with one or more embodiments of the invention includes an internal volume adapted to house electromagnetic interference (EMI) emitting devices; and a frame mountable chassis adapted to suppress EMI from the internal volume to an ambient environment by greater than 80 decibels.

In one aspect, a system for providing electromagnetic interference (EMI) suppression for data processing devices in accordance with one or more embodiments of the invention includes a frame adapted to receive a data processing device of the data processing devices; and the data processing device that includes a payload module adapted to suppress EMI from an internal volume to an ambient environment by greater than 80 decibels; and the internal volume adapted to house EMI emitting devices that generate EMI.

In one aspect, a method for managing electromagnetic interference (EMI), in accordance with one or more embodiments of the invention includes obtaining a device change request; in response to the device change request: terminating EMI generation by EMI emitting devices in an EMI suppressed internal volume of a data processing device to place the EMI emitting devices in a quiet state; placing the EMI suppressed internal volume into an EMI suppression compromised state to obtain access to the EMI emitting devices in the quiet state; replacing one of the EMI emitting devices in the quiet state, to obtain updated EMI emitting devices, while: the EMI suppressed internal volume is in the EMI compromised state, and the EMI emitting devices are in the quiet state; placing the EMI suppressed internal volume into an EMI suppressed state after replacing the one of the EMI emitting devices; and enabling EMI generation by the updated EMI emitting devices to place the updated EMI emitting devices into an active state.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an example system in accordance with one or more embodiments of the invention.

FIG. 1.2 shows a diagram of the example system of FIG. 1.1 in a first configuration in accordance with one or more embodiments of the invention.

FIG. 1.3 shows a diagram of the example system of FIG. 1.1 in a second configuration in accordance with one or more embodiments of the invention.

FIG. 2.1 shows a diagram of a data processing device in accordance with one or more embodiments of the invention.

FIG. 2.2 shows a first cut-view diagram of the data processing device of FIG. 2.1.

FIG. 2.3 shows a second cut-view diagram of the data processing device of FIG. 2.1.

FIG. 2.4 shows a third cut-view diagram of the data processing device of FIG. 2.1.

FIG. 3.1 shows a first cut-view diagram of a second data processing device in accordance with one or more embodiments of the invention.

FIG. 3.2 shows a second cut-view diagram of the second data processing device of FIG. 3.1.

DETAILED DESCRIPTION

Figure 4:
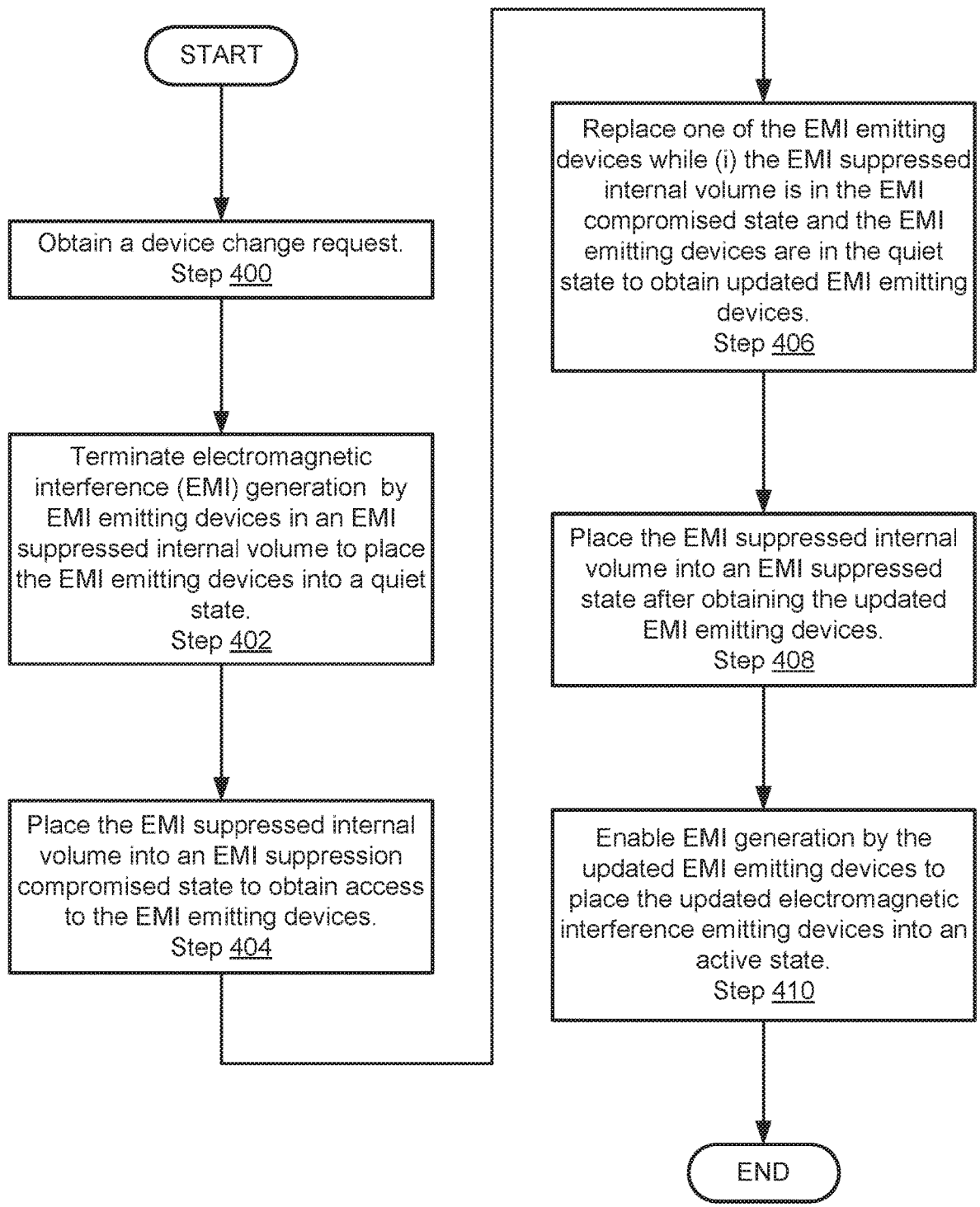
FIG. 4 shows a flowchart of a method of providing electromagnetic interference management services in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing electromagnetic interference in a high-density environment. Specifically, embodiments of the invention may provide a system that manages electromagnetic interference at a data processing device level. By doing so, embodiments of the invention may facilitate the inclusion of electromagnetic interference emitting devices in a high-density environment while mitigating the impact of electromagnetic interference generated by the electromagnetic interference emitting devices.

In one or more embodiments of the invention, a data processing device includes an internal volume for housing any number of electromagnetic interference emitting devices. The data processing devices may isolate the electromagnetic interference emitting devices from the ambient environment proximate to the data processing device by at least 90 decibels or another suitable level of isolation. For example, a data processing device in accordance with embodiments of the invention may provide greater than 35 decibels of isolation, between 35-50 decibels of isolation, between 50-65 decibels of isolation, between 65-80 decibels of isolation, and/or greater than 80 decibels of isolation.

The data processing devices may also facilitate the insertion, removal, and/or modification of electromagnetic interference emitting devices while maintaining the electromagnetic isolation of the aforementioned devices from the ambient environment. By doing so, such electromagnetic interference emitting devices may be utilized, in a high-density setting, while mitigating the potential impact on the high-density environment due to the inclusion of such devices in the environment.

FIG. 1.1 shows an example system in accordance with one or more embodiments of the invention. The system may include a frame (100) and any number of data processing devices (102). The components of the example system may provide electromagnetic interference management services for devices disposed within the data processing devices (102). By doing so, devices that emit electromagnetic interference may be utilized in a high-density computing environment without negatively impacting the high-density computing environment.

For example, one or more electromagnetic interference emitting devices may be disposed within one or more of the data processing devices (102). The system illustrated in FIG. 1.1 may manage the electromagnetic interference generated by the one or more electromagnetic interference emitting devices by (i) limiting the space in which electromagnetic interference is allowed to freely propagate and/or (ii) attenuating the electromagnetic interference as it propagates out of the limited space.

To do so, the system of FIG. 1.1 may reduce the strength of the electromagnetic interference when propagating from inside of a portion of the data processing devices (102) to an ambient environment around the data processing devices (102) and/or other locations by at least 90 decibels or another suitable level of isolation. The electromagnetic interference isolation provided by the data processing devices (102) may have a frequency dependent response. For example, the data processing devices (102) may provide at least 90 decibels, or another suitable level of isolation, across a frequency band in which devices that may be disposed within the data processing devices (102) are adapted to emit electromagnetic interference. In other frequency bands, the data processing devices (102) may provide different level or no electromagnetic interference isolation for devices disposed within the data processing devices (102).

Accordingly, a data processing device in accordance with one or more embodiments of the invention may provide electromagnetic interference suppression services that are frequency dependent. In one or more embodiments of the invention, a data processing device provides electromagnetic interference isolation by reducing the strength of electromagnetic interference across at least one frequency band by a predetermined amount (e.g., 90 decibels).

An electromagnetic interference emitting device may be any type of hardware device that intentionally emits electromagnetic radiation as part of its operation. The emissions of electromagnetic radiation may be, for example, continuous, periodic, or intermittent (e.g., at any point in time based on the operation of the respective electromagnetic interference emitting device). An electromagnetic interference emitting device may be, for example, a personal electronic device such as a cellular device (e.g., smart phone, cell phone, etc.), a personal computer (e.g., any type of computing device with wireless communications capabilities such as a tablet computer, a laptop computer, etc.), a watch (e.g., a wireless smart watch), or any other type of hardware device that intentionally emits electromagnetic radiation for any purpose (e.g., communications, detection, etc.).

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device in accordance with one or more embodiments of the invention may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

To further discuss aspects of embodiments of the disclosed technology, each component of the system of FIG. 1.1 is discussed below.

In one or more embodiments of the invention, the frame (100) is a physical structure. The physical structure may be adapted to facilitate storage of the data processing devices (102) in a high-density computing environment. The high-density computing environment may be, for example, a data center or another type of location where multiple data processing devices are located. To facilitate storage of the data processing devices (102), the frame (100) may include any number of structural members (e.g., beams, brackets, bars, etc.) and any number of mechanical mounting points (e.g., holes, threaded portions, etc.) disposed on the structural members to facilitate storage of the data processing devices (102).

Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting the data processing devices (102).

When all, or a portion, of the structural members are mechanically connected to each other, the mechanical mounting points may be disposed at predetermined locations. The predetermined locations may correspond to similar predetermination locations on the data processing devices (102) where mechanical mounting elements, complementary to the mechanical mounting point, are disposed. By doing so, the frame (100) and the data processing devices (102) may be adapted to position the data processing devices (102) in locations and/or orientations compatible with a high-density computing environment, or another environment in which the data processing devices (102) may be located.

The mechanical mounting points may be any type of physical structure for attaching (permanently or reversibly) the data processing devices (102) to the frame (100). There may be any number of mechanical mounting points to facilitate the attachment of any number of data processing devices.

The frame (100) may be implemented using any number of suitable materials. For example, portions of the frame (100) may be implemented using metals (e.g., steel, aluminum, etc.). In another example, portions of the frame (100) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the frame (100) may be implemented using rubber (e.g., latex, styrene-butadiene rubbers, etc.) The frame (100) may be implemented using any quantity and combination of suitable materials without departing from the invention.

In one or more embodiments of the invention, the data processing devices (102) are physical structures. For example, the data processing devices (102) may include a chassis and one or more computing devices disposed within the chassis. For details regarding computing devices, refer to FIG. 5.

A chassis may be a mechanical device that is adapted to (i) facilitate attachment of the data processing device to the frame, (ii) house the one or more computing devices, (iii) house one or more electromagnetic interference emitting devices, and/or (iv) provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example, portions of the chassis may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the chassis may be implemented using rubber (e.g., latex, styrene-butadiene rubbers, etc.) The chassis may be implemented using any quantity and combination of suitable materials without departing from the invention.

To facilitate attachment of the data processing device to the frame, the chassis may include any number of mechanical mounting elements. The mechanical mounting elements may be located at predetermined locations. The predetermined locations may correspond to similar predetermination locations on the frame (100) where mechanical mounting points, complementary to the mechanical mounting elements, are disposed.

For example, a mechanical mounting element may be a rail disposed on a side of a chassis of a data processing device. The location of the rail may correspond to a position on the frame (100) where a rail guide (i.e., a complementary mechanical mounting point) is disposed. The rail and the rail guide may facilitate attachment of a data processing device to the frame (100) which, in turn, positions and orients the data processing device relative to the frame (100).

To house the one or more computing devices, the chassis may include one or more internal volumes. The internal volumes may facilitate disposing of the one or more computing devices (and/or other devices) within a data processing device.

To house the one or more electromagnetic interference emitting devices, the chassis may include one or more internal volumes. The internal volumes may have a shape or other characteristic(s) that facilitates disposing of the one or more electromagnetic interference emitting devices within the data processing device. For example, an internal volume of the chassis may be a rectangular void capable of housing one or more electromagnetic interference emitting devices.

In one or more embodiments of the invention, the one or more internal volumes of the data processing devices are adapted to restrict propagation of electromagnetic interference emitted by the electromagnetic interference emitting devices (and/or other devices such as computing devices). For example, one or more portions of the chassis that bound the one or more internal volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely attenuated when leaving an internal volume) from propagating from within the data processing devices (102) into the ambient environment surrounding the respective data processing devices (102).

In another example, one or more portions of the chassis that bound the one or more internal regions may be formed in a manner that filters electromagnetic radiation when electromagnetic radiation passes through the portions of the chassis. For example, a portion of the chassis that bounds the one or more internal regions may be a waveguide filter such as an array of holes (e.g., sub-wavelength apertures corresponding to a particular frequency) in a metal sheet. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102).

In a further example, one or more portions of the chassis that bound the one or more internal regions may be made of an electromagnetic radiation attenuating material of a predetermined thickness to prevent and/or limit transmission of electromagnetic interference through the one or more portions of the chassis. The electromagnetic radiation attenuating material may be, for example, a composite of plastic or rubber that includes particulates of iron, carbonyl iron, or other electromagnetically lossy material. By doing so, the electromagnetic interference generated by the electromagnetic interference emitting devices may be severely attenuated (e.g., attenuated by greater than 90 decibels or another suitable level of isolation) when propagating from within the data processing devices (102) into the ambient environment surrounding the respective data processing devices (102).

To provide thermal management services to the computing devices and/or the electromagnetic interference emitting devices, the data processing devices (102) may facilitate the flow of gas proximate to the computing devices and/or electromagnetic interference emitting devices. By doing so, the thermal state (i.e., temperature) of the aforementioned devices may be regulated.

For example, a data processing device may include one or more vents that enable gas from a first side of a data processing device to flow into the data processing device, through the data processing device, and out of a second side of the data processing device. The gas, flowing through the data processing device, may be at a different temperature than the computing devices and/or electromagnetic interference emitting devices. Consequently, thermal exchange between the flow of gas and the aforementioned devices may occur resulting in the temperature of the aforementioned devices changing. By doing so, heat generated by the aforementioned devices may be expelled from the devices thereby regulating the temperature of the aforementioned devices.

A system in accordance with embodiments of the invention may include any number of data processing devices. Different data processing devices (102) may have different configurations and/or uses within the system.

For example, some data processing devices may be adapted to house many electromagnetic interference emitting devices while other data processing devices may be primarily adapted to house computing devices. Additional data processing devices may be adapted to exclusively house data processing devices and no electromagnetic interference emitting devices. A system in accordance with embodiments of the invention may include any number and combination of data processing devices adapted for any number of different uses without departing from the invention.

By way of example, the system of FIG. 1.1 may include a first data processing device (104). The first data processing device (104) may be of a larger size than a second data processing device (106) and, consequently, may be capable of housing a larger number of electromagnetic interference emitting devices. The system of FIG. 1.1 may further include a third data processing device (108). In contrast to the first data processing device (104) and the second data processing device (106), the internal structure of the third data processing device (108) may be adapted to only housing computing devices rather than electromagnetic interference generating devices.

For additional details regarding data processing devices, refer to FIGS. 2.1-2.6.

As discussed above, data processing devices (102) may house electromagnetic interference emitting devices. When so housed, the electromagnetic interference emitting devices may operate thereby generating electromagnetic interference. At different points in time, it may be useful to add or remove electromagnetic interference emitting devices to or from the data processing devices (102). To facilitate such additions and/or removals, different portions of the data processing devices (102) may be adapted to reversibly provide access to the internal volumes of the data processing devices.

For example, the different portions of the data processing devices (102) may be adapted to rotate, translate, or otherwise move with respect to the remaining portions of the data processing devices (102). When the different portions of the data processing devices (102) are in a first predetermination position and/or orientation, they may electromagnetically seal one or more internal volumes of the data processing devices (102). That is, they may limit the extent to which electromagnetic radiation within the internal volumes is able to propagate to an ambient environment. However, when the different portions of the data processing devices (102) are rotated, translated, and/or otherwise moved to a second predetermined position and/or orientation to enable access to the internal volumes, the data processing devices (102) may not be electromagnetically sealed. Consequently, electromagnetic radiation within the internal volumes may be less limited by the data processing devices (102) to propagate into the ambient environment when access to the internal volumes is provided.

The data processing devices (102) may include hinges, slides, knobs, and/or other mechanical devices that facilitate movement of the different portions of the data processing devices (102) to reversibly reconfigure the data processing devices (102) between states where access (i.e., physical accessibility) to the internal volumes of the data processing devices (102) is provided and states where access to the internal volumes of the data processing devices (102) is not provided. FIGS. 1.2-1.3 show diagrams of the data processing devices (102) facilitating the addition, modification, and/or removal of electromagnetic interference emitting devices from the internal volumes of the data processing devices (102).

While the system of FIG. 1.1 has been illustrated as including a limited number of components, a system in accordance with embodiments of the invention may include any number of frames, data processing devices, and/or other components without departing from the invention. For example, any number of frames (and/or other types of physical devices for positioning/orienting devices) may be used in a high density computing environment to facilitate the placement and/or orientation of any number of data processing devices. Further, the frames may be used to position and/or orient other types of devices. The other types of devices may be, for examples, servers, storage nodes, compute nodes, communication devices (e.g., switches, routers, etc. for facilitating communications between any number of devices and/or devices external to a high density computing environment), or any other type of device that may be used in a computing environment (e.g., data center, computing nodes, communications center, etc.). Thus, the frame and data processing devices may be used in conjunction with any number and/or type of other device without departing from the invention.

FIG. 1.2 shows a diagram of the example system of FIG. 1.1 in a configuration (i.e., after a reconfiguration from the configuration illustrated in FIG. 1.1) where a front vent (110) of the first data processing device (104) has been opened. The front vent (110) may be opened by physically rotating and/or translating the front vent (110) to move the front vent (110) to a new physical location. By opening the front vent (110), physical access to internal volumes of the first data processing device (104) may be provided. Consequently, the internal configuration of the internal volumes of the first data processing device (104) may be modified. For example, electromagnetic interference emitting devices may be removed from and/or added to the internal volumes. Similarly, computing devices may be added to and/or removed from the internal volumes.

However, in the state illustrated in FIG. 1.2, the ability of the first data processing device (104) to limit propagation of and/or attenuate electromagnetic interference generated by electromagnetic interference emitting devices disposed within the first data processing device (104) may be compromised. In other words, the first data processing device (104) may be in an electromagnetic interference suppression compromised state that allows electromagnetic interference within internal volumes of the first data processing device (104) to propagate to the ambient environment around the first data processing device (104) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels or another suitable level of attenuation when propagating out of the internal volumes).

In some embodiments of the invention, the first data processing device (104) automatically causes all, or a portion, of the electromagnetic interference emitting devices disposed within its internal volumes to suspend generation of electromagnetic interference when in the electromagnetic interference suppression compromised state illustrated in FIG. 1.2. By doing so, the first data processing device (104) may provide electromagnetic interference management services when the first data processing device (104) is in an electromagnetic interference suppression compromised state. All, or a portion, of the data processing devices of a system in accordance with embodiments of the invention may provide similar electromagnetic interference management services.

Similar to FIG. 1.2, FIG. 1.3 shows a diagram of the example system of FIG. 1.1 in a second configuration (i.e., after a reconfiguration from the configuration illustrated in FIG. 1.1) where a top door (112) of the second data processing device (106) has been opened after translating the second data processing device (106) with respect to the frame. The top door (110) may be all, or a portion, of the chassis that may be reversibly moved to enable access to internal volumes of the first data processing device (104).

Open the top door (112), for example, the second data processing device (106) may be mounted to the frame (100) via rails that enable the second data processing device (106) to translate with respect to the frame (100) via application of physical force. Once translated to a predetermined location, the top door (112) may be opened by application of physical force by a user.

By opening the top door (112), physical access to the internal volumes of the second data processing device (106) may be provided. Consequently, the internal configuration of the internal volumes of the second data processing device (106) may be modified. For example, electromagnetic interference emitting devices may be removed from and/or added to the internal volumes of the second data processing device (106). Similarly, computing devices may be added to and/or removed from the internal volumes of the second data processing device (106).

However, in the state illustrated in FIG. 1.3, the ability of the second data processing device (106) to limit propagation of and/or attenuate electromagnetic interference generated by electromagnetic interference emitting devices disposed within the second data processing device (106) may be compromised. In other words, the second data processing device (106) may be in an electromagnetic interference suppression compromised state that allows electromagnetic interference within internal volumes of the second data processing device (106) to propagate to the ambient environment around the second data processing device (106) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels or another suitable level of attenuation when propagating out of the internal volumes).

In some embodiments of the invention, the second data processing device (106) automatically causes all, or a portion, of the electromagnetic interference emitting devices disposed within its internal volumes to suspend generation of electromagnetic interference when in the electromagnetic interference suppression compromised state illustrated in FIG. 1.3. By doing so, the second data processing device (106) may provide electromagnetic interference management services when the second data processing device (106) is in an electromagnetic interference suppression compromised state. All, or a portion, of the data processing devices of a system in accordance with embodiments of the invention may provide similar electromagnetic interference management services (e.g., automatically terminating and/or resuming the electromagnetic interference generation depending on the electromagnetic interference suppression state of the data processing device).

Thus, as illustrated in FIGS. 1.1-1.3, a system in accordance with embodiments of the invention may provide electromagnetic interference management services to devices disposed with the data processing devices when the data processing devices are in an electromagnetic interference suppression compromised state or an electromagnetic interference suppressed state.

As discussed above, a system in accordance with one or more embodiments of the invention may include one or more data processing devices. FIGS. 2.1-3.2 show diagrams of data processing devices in accordance with embodiments of the invention. FIGS. 2.1-2.4 show diagrams of the second data processing device (106) of FIG. 1.1 while FIGS. 3.1-3.2 show diagrams of the first data processing device (104).

FIG. 2.1 shows a diagram of the second data processing device (106) in accordance with one or more embodiments of the invention. As discussed above, the second data processing device (106) may provide electromagnetic interference management services for electromagnetic interference emitting devices disposed within the second data processing device (106). To do so, the second data processing device (106) may include a front vent (200), a rear vent (204), a support module (208), and a payload module (210). Each of these components of the second data processing device (106) is discussed below.

The front vent (200) may be a physical device for (i) enabling airflow through the second data processing device (106) and (ii) limiting the propagation of electromagnetic interference from an internal volume of the second data processing device (106) and/or attenuating electromagnetic interference that propagates from an internal volume of the second data processing device (106) to an ambient environment around the second data processing device (106) via the front vent (200). For additional details regarding the internal volume and propagation of electromagnetic interference via the front vent (200), refer to FIGS. 2.2-2.4.

In one or more embodiments of the invention, the front vent (200) is a rectangular structure formed with holes (202) that enables gasses to flow between the ambient environment surrounding the second data processing device (106) and an internal volume of the second data processing device (106). By doing so, the second data processing device (106) may provide thermal management services to components disposed within the second data processing device (106) by controlling the flow of gasses from the ambient environment through the second data processing device (106).

For example, the second data processing device (106) may be used in a high-density computing environment in which a source of cool gas is supplied to a first side of the second data processing device (106). In such an environment, the second data processing device (106) may cause cool gas to flow into the second data processing device (106) via the front vent (200) and exhaust the cool gas (which may be at a higher temperature after exchanging heat as the gas traverses the second data processing device (106)) by flowing out a second side of the second data processing device (106) (e.g., out of the support module (208)). Alternatively, the second data processing device (106) may cause a reverse airflow, of that discussed above, if the source of cool gas is supplied proximate to the support module (208) rather than proximate to the front vent (200).

The structure of the front vent (200) may also be adapted to limit propagation of electromagnetic radiation through the front vent (200) and/or attenuate electromagnetic radiation that propagates through the front vent (200). For example, the size, position, number, shape, and/or other characteristics of the holes (202) through the front vent may be adapted to (i) limit propagation of electromagnetic radiation and/or (ii) attenuate propagating electromagnetic radiation. In another example, the thickness and material choice of the front vent (200) may be adapted to (i) limit propagation of electromagnetic radiation and/or (ii) attenuate propagating electromagnetic radiation. By being so adapted, the front vent (200) may attenuate electromagnetic radiation that propagates through the front vent (200) by at least 90 decibels or another suitable level of attenuation.

To facilitate the flow of air between the ambient environment and the internal volume of the second data processing device (106), the size, position, number, shape, and/or other characteristics of the holes (202) may be selected. The aforementioned characteristics of the holes (202) may be selected to enable a rate of the flow of gas to meet cooling requirements of one or more devices disposed in a data processing device.

In one or more embodiments of the invention, the rear vent (204) is similar to the front vent (200). For example, the rear vent (204) may provide similar attenuation and/or restriction of propagation of electromagnetic radiation while enabling gasses to flow between internal volumes of the second data processing device. The rear vent (204) may have a similar structure to that of the front vent (200). However, the structure (e.g., different hole pattern, thickness, hole type, etc.) and/or electromagnetic (e.g., attenuation and/or reflection of electromagnetic radiation) and/or hydrodynamic (e.g., impedance to fluid flow) characteristics of the rear vent (204) may be different from the front vent (200) without departing from the invention.

For example, the rear vent (204) may be smaller than the front vent (200), the rear vent (204) may include different shaped holes when compared to the holes of the front vent (200), the thickness of the rear vent (204) may be different from the thickness of the front vent (200), etc. These differences in physical characteristics may give rise to different electromagnetic and/or hydrodynamic characteristics of the rear vent (204) when compared to similar characteristics of the front vent (200).

The payload module (210) may be a physical device for (i) housing electromagnetic interference devices, (ii) limiting propagation of electromagnetic interference from internal volumes of the second data processing device (106) to the ambient environment surrounding the second data processing device (106), and (iii) thermally regulating devices disposed within the payload module (210). For additional details regarding the payload module (210), refer to FIGS. 2.2-2.4.

The support module (208) may be a physical device for housing devices that provide services to devices disposed within the payload module (210). For example, the support module (208) may house one or more power supplies, fans, communications devices, and/or computing devices. The aforementioned devices may provide corresponding services to devices disposed in other portions of the second data processing device (106) and/or devices located in other locations (i.e., external to the second data processing device (106).

The one or more power supplies may supply power to other devices. For example, the power supplies may provide power to electromagnetic interference devices disposed within the payload module, other types of devices (e.g., computing device) disposed within the payload module, and/or devices located in other areas of the second data processing device.

The one or more power fans may provide thermal management services to other devices. For example, the fans may regulate the flow of gasses through the second data processing device.

The one or more power communication devices may provide communication services to other devices. For example, the communication devices may manage network interfaces that enables the electromagnetic interference emitting devices disposed within the payload module (210) to communicate with other devices (e.g., computing devices that may be controlling the operation of the electromagnetic interference emitting devices).

The one or more computing devices may manage the operations of the other entities of the second data processing device (106). For example, the computing devices may send messages to the electromagnetic interference emitting devices to perform predetermined functionality. Such messages, when received by the electromagnetic interference emitting devices may cause the electromagnetic interference emitting devices to stop and/or start emitting electromagnetic interference.

The computing devices may send such instructions when (or around the time when) the electromagnetic interference suppression state of the second data processing device (106) is changed (i.e., when portions of the second data processing device (106) are physically reconfigured). The computing devices may make such determinations based on any number of sensors (not shown) that monitor the physical configuration of the second data processing device (106). The sensors may be disposed, for example, in the payload module, on the vents, or at other locations such that measurements by the sensors indicate the thermal state of components of the second data processing device for which thermal management services (e.g., monitoring the thermal state of components and taking actions such as modifying the rate of gas flow to manage the thermal state of the components) are being provided.

In another example, the computing devices may send messages to fan controllers (not shown) or other devices that manage the operation of gas flow control devices disposed within the second data processing device (106). The computing devices may send such messages based on the thermal state (i.e., temperature) of one or more devices disposed within the second data processing device (106). The computing devices may monitor such thermal states using any number of sensors (not shown) and/or based on messages received from the one or more devices disposed within the second data processing device (106).

In response to receipt of such messages, the fan controllers or other devices may modify the operational state of the gas flow control devices. By doing so, the computing devices may change the thermal state of devices disposed within the second data processing device (106) by controlling the flow of gasses through the second data processing device (106).

To manage the operation of the other entities of the second data processing device (106), one or more processors of the computing devices may execute instructions (e.g., computer code), stored on a persistent storage, that cause the computing devices to perform all, or a portion, of the method illustrated in FIG. 4. For additional details regarding computing devices, refer to FIG. 5.

To further clarify aspects of embodiments of the invention, a cut-view diagram of the second data processing device (106) in accordance with one or more embodiments of the invention is shown in FIG. 2.2. In FIG. 2.2, the second data processing device (106) has been cut along the X-Y plane illustrated in FIG. 2.1 and a portion, defined by the X-Y plane, has been removed to expose portions of the internal structure of the second data processing device (106).

As seen from FIG. 2.2, the payload module (210) may include an internal volume (214). The internal volume (214) may be used to house devices such as electromagnetic interference emitting devices, supports for such devices, and/or other devices that may provide services to the electromagnetic interference emitting devices and/or other devices.

The internal volume (214) may be bounded, on four sides, by portions of the payload module (210). For example, the internal volume (214) may be bounded by a top door (212), a bottom (218), a first side (216), and a second side (not shown). These four components of the payload module (210) may define a rectangular shape of the internal volume (214).

The internal volume (214) may be further bounded, on a fifth and sixth side, by the front vent (200) and the rear vent (204). The front vent (200) and the rear vent (204) may be on opposite sides of the internal volume (214). By doing so, the front vent (200) and the rear vent (204) may define an airflow path through the payload module (210). For example, gasses may be able to flow from between the two vents through the internal volume (214). As discussed above, to control such airflow fans, or other airflow control devices, may be disposed in the support module (208). Airflow control devices may be disposed in other locations (e.g., in the payload module, on an exterior of the front vent (200), etc.) to control the flow of gasses through the payload module (210) without departing from the invention.

While the payload module (210) and internal volume (214) have been illustrated as having a rectangular shape, the aforementioned components may be of different types of shapes without departing from the invention. Further, while the front vent (200) and the rear vent (204) have been described as being disposed on opposite sides of the internal volume (214), the vents may be located at other locations to define airflow paths of different shapes without departing from the invention. For example, the rear vent (204) may be aligned with the bottom (218), the top door (212), or the sides (e.g., 216) to define an airflow path having a turn (rather than being a straight line).

The airflow path through the internal volume (214) may be of any shape without departing from the invention. The internal volume (214) may include any number of airflow paths (i.e., the internal volume (214) may be bounded by additional vents other than the front vent (200) and the rear vent (204)).

To further clarify aspects of embodiments of the invention, FIGS. 2.3-2.4 illustrate examples of the second data processing device (106) where the internal volume (214) has been partially filled with devices.

FIG. 2.3 shows a cut-view diagram, similar to that of FIG. 2.2, where an electronics payload (220), a tray (222), and multiple electromagnetic interference emitting devices (224) have been placed in the internal volume. Such devices may have been placed in the internal volume (214) by utilizing the top door (212).

The electronics payload (220) may be a physical device. The electronics payload (220) may be, for example, an access point. The access point may enable the electromagnetic interference emitting devices (224) to communicate with other devices using a wireless link between the access point and the electromagnetic interference emitting devices (224). For example, the access point may support a local area network via wireless connections between the electronics payload (220) and the electromagnetic interference emitting devices (224).

The electronics payload (220) may be disposed at a location within the internal volume (214, FIG. 2.1) to facilitate wireless communications between the electronics payload (220) and the electromagnetic interference emitting devices (224). The electronics payload (220) may be connected to other devices (e.g., the Internet) via any combination of wired and/or wireless networks. For example, the electronics payload (220) may be operably connected to a router (connected to the Internet) via a wired connection.

The tray may be a physical device. The tray (222) may position and/or orient any number of electromagnetic interference emitting devices (224) disposed within the internal volume (214, FIG. 2.2). For example, the tray (222) may be a sheet of material mechanically connected to the walls, bottom, top, vents, or any other physical components of the second data processing device.

The tray (222) may include physical, optical, or any other type of indicator for positioning any number of the electromagnetic interference emitting devices (224) on the tray. For example, the tray (222) may include indentations corresponding to a shape of the electromagnetic interference emitting devices (224). By doing so, any number of electromagnetic interference emitting devices (224) may be positioned and/or oriented within the internal volume of the second data processing device.

The example disposition of electromagnetic interference emitting devices (224) within the second data processing device illustrated in FIG. 2.3 may be considered to be in a low-density state. That is, the internal volume is relatively sparsely populated with electromagnetic interference emitting devices (224).

In contrast, FIG. 2.4 shows a second example of electromagnetic interference emitting devices (224) and trays (226) in a high-density state. That is, the internal volume of the second data processing device may include numerous electromagnetic interference emitting devices (224). In the state illustrated in FIG. 2.4, large amounts of electromagnetic interference and heat may be generated by the electromagnetic interference emitting devices (224). However, the electromagnetic interference generated by the electromagnetic interference emitting devices (224) may be generally contained within the internal volume of the second data processing devices.

For example, electromagnetic radiation of the electromagnetic interference impinging on the top door, the sides, and the bottom of the second data processing device may be locked (i.e., reflected towards the internal volume) within the internal volume rather than being allowed to propagate to the ambient environment surrounding the internal volume. Electromagnetic radiation of the electromagnetic interference impinging on the front vent and the rear vent may, similarly, be locked (i.e., reflected towards the internal volume) within the internal volume and/or attenuated by at least 90 decibels (or a different suitable level) as the electromagnetic radiation propagates through the vents and into the ambient environment surrounding the second data processing device. Consequently, the electromagnetic interference emitting devices (224) disposed within the internal volume of the second data processing device may be isolated from the ambient environment surrounding the second data processing device by at least 90 decibels (or a different suitable level).

While the second data processing device has been illustrated as including a limited number of components disposed in specification locations and orientations in FIGS. 2.3 and 2.4, a data processing device in accordance with embodiments of the invention may include any number of electromagnetic interference emitting devices (224), any number of other positioning devices (e.g., trays or other mechanical structure for positioning purposes), any number of electronics payloads (e.g., 220), and/or other types of devices (e.g., other computing devices) any orientation and disposed at any location without departing from the invention.

To further clarify aspects of embodiments of the invention, FIGS. 3.1-3.2 show diagrams of the first data processing device (104) of FIG. 1.1. As discussed above, different types of data processing devices may have different structures, be of different sizes and/or shapes, and may be adapted to house different types of devices.

FIG. 3.1 shows a cut-view diagram of the first data processing device (104) in accordance with one or more embodiments of the invention. The view of FIG. 3.1 may be similar to that of FIG. 2.1 (i.e., utilizing an X-Y plane similar positioned as in FIG. 2.1). As discussed above, the first data processing device (104) may provide electromagnetic interference management services for electromagnetic interference emitting devices disposed within the first data processing device (104). To do so, the first data processing device (104), like the second data processing device (106, FIG. 1.1) may include a front vent (302), a rear vent (304), a support module (308), and a payload module (310).

These components, similarly named to those illustrated in FIG. 2.1, may perform similar functions. However, due to size differences between the first and second data processing devices, the payload module (310) may enable a different internal configuration to be used within the internal volume of the payload module (310).

For example, like the second data processing device, the first data processing device (104) may include trays (332). The trays (332) may be disposed further from one another when compared to the trays illustrated in FIG. 2.4. By doing so, electromagnetic interference emitting devices may be differently oriented when compared to FIGS. 2.3 and 2.4. Such orientation differences may be made when placing the electromagnetic interference devices via a top door (312) or other reconfigurable portion of the first data processing device.

Additionally, due to the larger size of the internal volume, multiple electronic payloads (320) may be disposed within the internal volume. Like the electronic payloads discussed with respect to FIG. 2.3, each of the electronic payloads (320) may facilitate communications between the electromagnetic interference emitting devices disposed within the first data processing device (104) and other devices. For example, the electronics payloads (320) may be access points that support operable wireless connections with the electromagnetic interference emitting devices. While illustrated in FIG. 3.1 as only including two such electronics payloads, a data processing device may include any number of electronics payloads without departing from the invention. Each of the electronics payloads may perform similar and/or different functions. For example, some electronics payloads may provide communication services while other may provide, for example, thermal management services.

Each of the electronics payloads (320) may provide such services to any number of electromagnetic interference emitting devices. FIG. 3.2 shows a diagram of the first data processing device (104) in accordance with one or more embodiments of the invention. As seen in FIG. 3.2, the first data processing device (104) is in a high-density state where numerous electromagnetic interference emitting devices (334) have been added to its internal volume.

In this state, the electronics payloads (320) may provide services (e.g., communication, thermal, etc.) to the electromagnetic interference emitting devices (334). For example, different portions of the electromagnetic interference emitting devices (334) disposed proximate to each of the respective electronics payloads (320) may utilize the services provided by the respective proximate electronics payloads (320). In another example, the electronics payloads (320) may logically divide the electromagnetic interference emitting devices (334) into different groups to which the respective electronics payloads (320) provide services. The groupings may be dynamically changed to appropriately load balance the services provided by each of the electronics payloads (320) as the demand for services changes over time.

For example, depending on the workloads being performed by each of the electromagnetic interference emitting devices (334), the services utilized by the respective electromagnetic interference emitting devices (334) may dynamically change. The electronics payloads (320) may update the logical divisions of the electromagnetic interference emitting devices (334) according to the dynamically changing services demands of the electromagnetic interference emitting devices (334).

Additionally, as seen from FIG. 3.2, the orientation of the electromagnetic interference emitting devices (334) may be different from that illustrated in FIG. 2.4. Consequently, the density of the electromagnetic interference emitting devices (334) may be improved and/or the orientation of the electromagnetic interference emitting devices (334) may be different to meet other goals (e.g., connectivity between the electromagnetic interference emitting devices (334) and the electronics payloads (320)).

Thus, as illustrated in FIGS. 1.1-3.2, a system in accordance with embodiments of the invention may facilitate the inclusion of numerous electromagnetic interference emitting devices in a high-density environment. Such electromagnetic interference emitting devices may be included for any purposes (e.g., testing).

To further clarify aspects of embodiments of the invention, a method that may be performed in conjunction and/or separately from the system of FIG. 1.1 is illustrated in FIG. 4. The aforementioned method may be performed when providing electromagnetic interference management services.

FIG. 4 shows a flowchart of a method in accordance with one or more embodiments of the invention. The method depicted in FIG. 4 may be used to manage electromagnetic interference in accordance with one or more embodiments of the invention. The method shown in FIG. 4 may be performed completely, or in part, by, for example, data processing devices (e.g., 102, FIG. 1.1). Other components of the system illustrated in FIG. 1.1 may perform all, or a portion, of the method of FIG. 4 without departing from the invention.

While FIG. 4 is illustrated as a series of steps, any of the steps may be omitted, performed in a different order, additional steps may be included, and/or any or all of the steps may be performed in a parallel and/or partially overlapping manner without departing from the invention.

In step 400, a device change request is obtained.

The device change request may be obtained from a user. For example, the user may, send via a computing device, a message including the change request. The change request may specify a change to electromagnetic interference emitting devices disposed within a computing device.

In step 402, electromagnetic interference generation by electromagnetic interference emitting devices in an internal volume of the data processing device may be terminated to place the internal volume into a quiet state.

The electromagnetic interference generation may be terminated by sending a request to the electromagnetic interference emitting devices to terminate such generation. For example, the data processing device may send the request to the electromagnetic interference emitting devices using an electronics payload disposed within the internal volume. In response to receiving the request, the electromagnetic interference emitting devices may suspend generation of electromagnetic interference in response to the request (i.e., the quiet state).

The internal volume may be an electromagnetic interference suppressed volume, An electromagnetic interference suppressed volume may be a volume that reduces the strength of electromagnetic interference that propagates from within the internal volume to outside of the internal volume by at least 90 decibels. The suppression factor 90 decibels or a different suitable level) may be different quantities without departing from the invention. In one or more embodiments of the invention, the suppression factor is between 30-40 decibels. In one or more embodiments of the invention, the suppression factor is between 40-50 decibels. In one or more embodiments of the invention, the suppression factor is between 50-60 decibels. In one or more embodiments of the invention, the suppression factor is between 60-70 decibels. In one or more embodiments of the invention, the suppression factor is between 70-80 decibels. In one or more embodiments of the invention, the suppression factor is between 80-90 decibels. In one or more embodiments of the invention, the suppression factor is greater than 90 decibels.

In step 404, the internal volume is placed into an electromagnetic interference compromised state to obtain access to the electromagnetic interference emitting devices.

In one or more embodiments of the invention, the internal volume is placed into the electromagnetic interference compromised state by changing a configuration of the data processing device. For example, a portion of the data processing device bounding the internal volume may be modified (e.g., translated, rotate, etc.) opening, electromagnetically, the internal volume. In the electromagnetic interference suppression compromised state the data processing device may not isolate the internal volume by greater than 90 decibels (or a different suitable level) from the ambient environment surrounding the data processing device. While in the electromagnetic interference compromised state, physical access to the electromagnetic interference emitting devices may be enabled due to the configuration change of the data processing device.

In Step 406, one of the electromagnetic interference emitting devices is replaced while the internal volume is in the electromagnetic interference suppression compromised state and the electromagnetic interference emitting devices are in the quiet state to obtain an updated electromagnetic interference emitting devices.

For example, while a top door of the data processing device is open and the electromagnetic interference emitting devices are in the quiet state, one of the electromagnetic interference emitting devices may be physically removed and a second electromagnetic interference emitting device may be added to the internal volume as a replacement for the removed electromagnetic interference emitting device.

Alternatively, one of the electromagnetic interference emitting devices may simply be removed to obtain the updated electromagnetic interference emitting devices.

In an additional alternative, a new electromagnetic interference emitting device may be added to the electromagnetic interference emitting devices to obtain the updated electromagnetic interference emitting devices.

In Step 408, the internal volume is placed into an electromagnetic interference suppressed state after obtaining the updated electromagnetic interference emitting devices.

The internal volume may be placed into the electromagnetic interference suppressed state by reversing the action(s) performed in step 404. For example, the top door may be closed, a front vent may be closed, etc. By doing so, the internal volume may be isolated from the ambient environment by at least 90 decibels (or a different suitable level).

In Step 410, electromagnetic interference generation by the updated electromagnetic interference emitting devices is enabled to place the updated electromagnetic interference emitting devices into an active state.

For example, a message may be sent, similar to that of step 402, to the updated electromagnetic interference emitting devices. The message may indicate that the updated electromagnetic interference emitting devices may result generation of electromagnetic interference.

Thus, via the method illustrated in FIG. 4, electromagnetic interference emitting devices disposed within a data processing device may be updated while reducing the likelihood of electromagnetic interference impacting the operation of devices disposed proximate to the data processing device.

Figure 5:
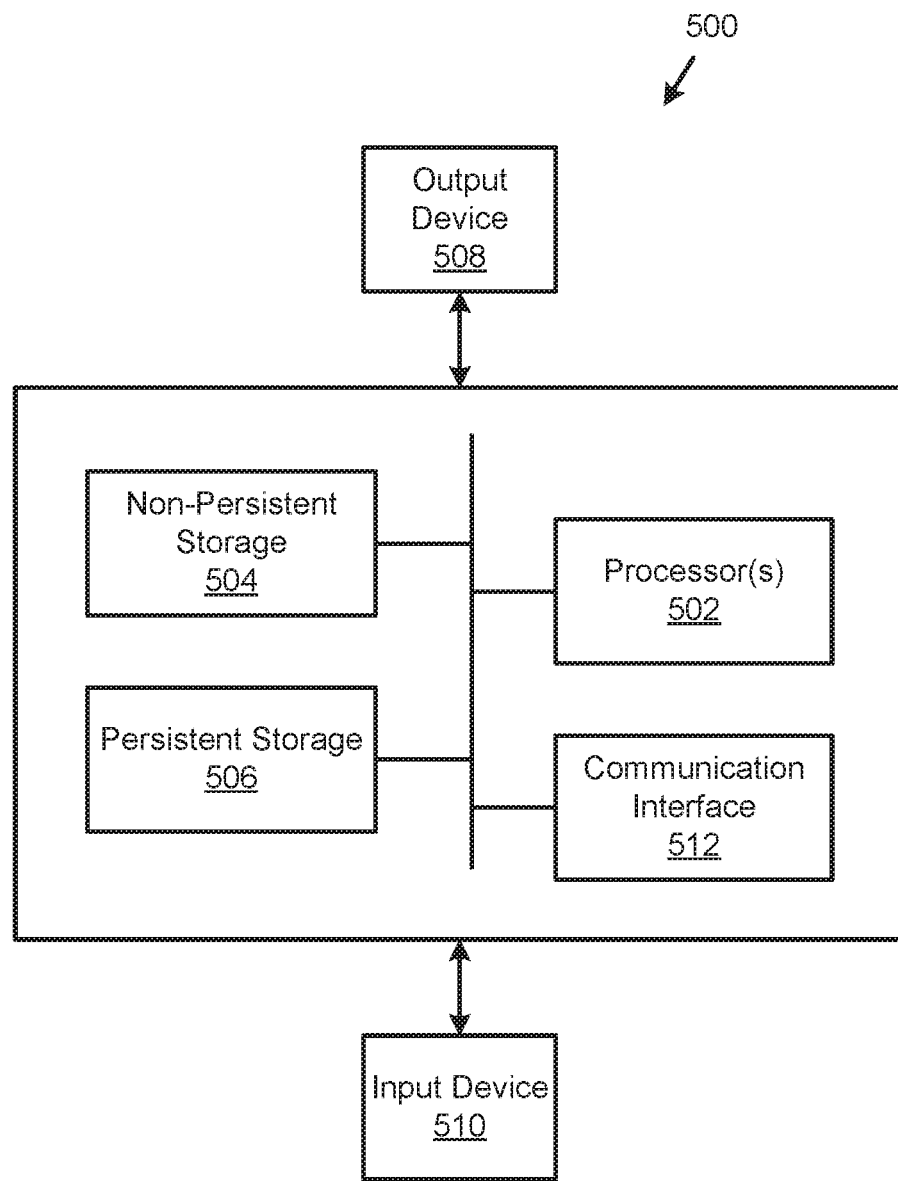
FIG. 5 shows a diagram of a computing device in accordance with one or more embodiments of the invention.

As discussed above, embodiments of the invention may be implemented using computing devices. FIG. 5 shows a diagram of a computing device in accordance with one or more embodiments of the invention. The computing device (500) may include one or more computer processors (502), non-persistent storage (504) (e.g., volatile memory, such as random access memory (RAM), cache memory), persistent storage (506) (e.g., a hard disk, an optical drive such as a compact disk (CD) drive or digital versatile disk (DVD) drive, a flash memory, etc.), a communication interface (512) (e.g., Bluetooth interface, infrared interface, network interface, optical interface, etc.), input devices (510), Output devices (508), and numerous other elements (not shown) and functionalities. Each of these components is described below.

In one embodiment of the invention, the computer processor(s) (502) may be an integrated circuit for processing instructions. For example, the computer processor(s) may be one or more cores or micro-cores of a processor. The computing device (500) may also include one or more input devices (510), such as a touchscreen, keyboard, mouse, microphone, touchpad, electronic pen, or any other type of input device. Further, the communication interface (512) may include an integrated circuit for connecting the computing device (500) to a network (not shown) (e.g., a local area network (LAN), a wide area network (WAN) such as the Internet, mobile network, or any other type of network) and/or to another device, such as another computing device.

In one embodiment of the invention, the computing device (500) may include one or more output devices (508), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (502), non-persistent storage (504), and persistent storage (506), Many different types of computing devices exist, and the aforementioned input and output device(s) may take other forms.

Embodiments of the invention may provide a method, system, and device for managing electromagnetic interference. A system in accordance with embodiments of the invention may manage electromagnetic interference at a data processing device level. That is, such a data processing device may include functionality to limit the propagation of electromagnetic interference from within data processing devices to an ambient environment surrounding the data processing device. By doing so, such data processing devices may be used in a high-density environment without negatively impacting the functionality of the high-density environment.

Thus, embodiments of the invention may address the problem of electromagnetic interference within a high-density environment. Specifically, embodiments of the invention may provide a data processing device level solution that facilitates granular control of electromagnetic interference in the aforementioned environments.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A system for providing electromagnetic interference (EMI) suppression for data processing devices, comprising:
   a frame adapted to receive a data processing device of the data processing devices;
   and the data processing device comprising:
      a payload module adapted to suppress EMI from an internal volume to an ambient environment by greater than 80 decibels;
      the internal volume adapted to house EMI emitting devices that generate the EMI;
      a front vent directly attached to a front of the payload module and adapted to suppress the EMI from the internal volume to the ambient environment by greater than 80 decibels;
      a rear vent directly attached to a rear of the payload module and adapted to suppress the EMI from the internal volume to the ambient environment by greater than 80 decibels, wherein the rear vent is directly attached to the rear of the payload module at a first opening side of the rear vent;
      a support module comprising a fan and adapted to regulate a flow of gasses within the internal volume of the data processing device, wherein the support module is disposed in the ambient environment and attached to a second opening side of the rear vent opposite to the first opening side, wherein the fan faces the rear vent and the front vent such that gases flowing into the front vent are pulled by the fan towards the rear vent in a straight line through the payload module and exhausted out of the rear vent; and
      a computing device disposed on an internal surface of the data processing device that wirelessly communicates with each of the EMI emitting devices and that causes, when receiving an instruction to terminate EMI emission from a user of the data processing device, the EMI devices to terminate generation of the EMI.

2. The system of claim 1, wherein the front vent and the rear vent define an airflow path through the internal volume.

3. The system of claim 1, wherein the front vent is adapted to rotate from a first position that electromagnetically seals the internal volume to a second position that:
   electromagnetically opens the internal volume; and
   enables physical access to the EMI emitting devices.

4. The system of claim 1, wherein the payload module comprises:
   a top door adapted to suppress the electromagnetic interference from the internal volume to the ambient environment by greater than 80 decibels;
   a first side adapted to suppress the electromagnetic interference from the internal volume to the ambient environment by greater than 80 decibels;
   a second side adapted to suppress the electromagnetic interference from the internal volume to the ambient environment by greater than 80 decibels; and
   a bottom adapted to suppress the electromagnetic interference from the internal volume to the ambient environment by greater than 80 decibels,
   wherein the top door, the first side, the second side, and the bottom bound four sides of the internal volume.

5. The system of claim 4, wherein:
   the front vent, while in a first position, bounds a fifth side of the internal volume.

6. The system of claim 5, wherein
   the rear vent, while in a first position, bounds a sixth side of the internal volume.

7. The system of claim 1, wherein the EMI emitting devices are personal electronic devices.

8. The system of claim 7, wherein the personal electronic devices comprise a cell phone.

9. The system of claim 7, wherein the personal electronic devices comprise a tablet computer.

10. The system of claim 1, further comprising:
    a second data processing device comprising a second internal volume,
    wherein the second internal volume is adapted to house second EMI emitting devices in an orientation that is different from an orientation in which the internal volume is adapted to house the EMI emitting devices.

11. The system of claim 1, further comprising:
a second data processing device comprising a second internal volume,
wherein the second internal volume is adapted to house second EMI emitting devices of a first device type that is different from a second device type which the internal volume is adapted to house.

12. The system of claim 1, wherein only the data processing devices of the system are adapted to provide EMI suppression.

* * * * *